(12) United States Patent
Sakata et al.

(10) Patent No.: US 11,069,700 B2
(45) Date of Patent: Jul. 20, 2021

(54) SEMICONDUCTOR STORAGE DEVICE AND METHOD OF MANUFACTURING THE SAME

(71) Applicant: TOSHIBA MEMORY CORPORATION, Tokyo (JP)

(72) Inventors: Koichi Sakata, Yokkaichi Mie (JP);
Kazutaka Suzuki, Kuwana Mie (JP);
Hiroaki Ashidate, Mie Mie (JP);
Katsuhiro Sato, Yokkaichi Mie (JP);
Satoshi Nakaoka, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/555,418

(22) Filed: Aug. 29, 2019

(65) Prior Publication Data
US 2020/0295027 A1    Sep. 17, 2020

(30) Foreign Application Priority Data
Mar. 12, 2019 (JP) .............................. JP2019-044991

(51) Int. Cl.
*H01L 27/11578* (2017.01)
*H01L 27/11565* (2017.01)
(Continued)

(52) U.S. Cl.
CPC .... *H01L 27/11578* (2013.01); *H01L 27/0688* (2013.01); *H01L 27/11565* (2013.01);
(Continued)

(58) Field of Classification Search
CPC ......... H01L 27/11582; H01L 27/11565; H01L 27/1157; H01L 29/7926; H01L 21/76897;
(Continued)

(56) References Cited

U.S. PATENT DOCUMENTS 9,147,468 B1    9/2015    Lue
9,768,018 B2    9/2017    Seo
(Continued)

FOREIGN PATENT DOCUMENTS

JP    WO2018055704    *    3/2018

OTHER PUBLICATIONS

DOC1 (Layer Meaning) (Year: 2020).*

*Primary Examiner* — Yasser A Abdelaziez
(74) *Attorney, Agent, or Firm* — Foley & Lardner LLP

(57) ABSTRACT

A semiconductor storage device includes a first stacked body, a second stacked body, a first division film, a second division film, and a plurality of discrete films. The a first stacked body includes first electrode layers stacked in a first direction. The second stacked body, above the first stacked body, includes second electrode layers stacked in the first direction. The second semiconductor layer is electrically connected to the first semiconductor layer. The first division film, extending in the first direction through the first stacked body, divides the first stacked body in a second direction crossing the first direction. The second division film, extending in the first direction through the second stacked body, divides the second stacked body in the second direction. The discrete films, extending in the first direction through the second stacked body, are disposed above the first division film.

11 Claims, 14 Drawing Sheets

(51) Int. Cl.
  *H01L 27/11573*  (2017.01)
  *H01L 27/06*  (2006.01)
  *H01L 27/11582*  (2017.01)
  *H01L 27/11568*  (2017.01)

(52) U.S. Cl.
  CPC .. *H01L 27/11568* (2013.01); *H01L 27/11573* (2013.01); *H01L 27/11582* (2013.01)

(58) Field of Classification Search
  CPC ......... H01L 21/823487; H01L 27/0688; H01L 27/11578; H01L 27/11568; H01L 27/11573; H01L 27/11551
  See application file for complete search history.

(56) References Cited

U.S. PATENT DOCUMENTS

| | | | |
|---|---|---|---|
| 9,865,685 B2 | 1/2018 | Sim | |
| 2015/0340371 A1* | 11/2015 | Lue | H01L 27/11582 257/324 |
| 2016/0268303 A1* | 9/2016 | Kawai | H01L 29/40117 |
| 2018/0269219 A1* | 9/2018 | Ito | H01L 27/11575 |
| 2019/0252397 A1* | 8/2019 | Sakamoto | H01L 29/792 |
| 2019/0371813 A1* | 12/2019 | Oike | H01L 27/11565 |
| 2020/0212059 A1* | 7/2020 | Nishikawa | H01L 27/1157 |
| 2020/0303402 A1* | 9/2020 | Kobayashi | H01L 27/11565 |

* cited by examiner

SEMICONDUCTOR STORAGE DEVICE AND METHOD OF MANUFACTURING THE SAME

CROSS-REFERENCE TO RELATED APPLICATION(S)

This application is based upon and claims the benefit of priority from Japanese Patent Application No. 2019-044991, filed Mar. 12, 2019, the entire contents of which are incorporated herein by reference.

FIELD

Embodiments of the present disclosure described herein relate generally to a semiconductor storage device and a method of manufacturing the same.

BACKGROUND

A procedure for manufacturing a three-dimensional semiconductor memory, which is one of semiconductor storage devices, includes a step of replacing insulating layers of a stacked body with electrode layers. At this step, for example, a predetermined number of slits are formed to divide the stacked body into erasing block units, and these slits are used to remove the insulating layers.

Generally, in the three-dimensional semiconductor memory, the number of layers of the stacked body tends to increase in accordance with an increase in the capacity. As the number of layers of the stacked body increases, width of the slits tends to be larger on a lower layer side than on an upper layer side after removing the insulating layers. Such an increase in the number of layers of the stacked body leads to formation of wider slits, accordingly increasing memory area in area and increasing the whole semiconductor storage device in size.

Examples of related art include U.S. Pat. No. 9,768,018.

DETAILED DESCRIPTION

At least one embodiment provides a semiconductor storage device and a method of manufacturing the same that prevent a memory area from increasing in area and prevent the whole semiconductor storage device from increasing in size.

In general, according to at least one embodiment, a semiconductor storage device includes a first stacked body, a second stacked body, a first memory pillar, a second memory pillar, a first division film, a second division film, and a plurality of discrete films. The first stacked body includes a plurality of first electrode layers stacked in a first direction. The second stacked body, disposed above the first stacked body, includes a plurality of second electrode layers stacked in the first direction. The first memory pillar, extending in the first direction through the first stacked body, includes a first semiconductor layer and a first charge storage layer. The second memory pillar, extending in the first direction through the second stacked body, includes a second semiconductor layer and a second charge storage layer. The second semiconductor layer is electrically connected to the first semiconductor layer. The first division film, extending in the first direction through the first stacked body, divides the first stacked body in a second direction crossing the first direction. The second division film, extending in the first direction through the second stacked body, divides the second stacked body in the second direction. The plurality of discrete films, extending in the first direction through the second stacked body, are disposed above the first division film. A material of each of the plurality of discrete films is identical to a material of the first division film.

Embodiments of the present disclosure will now be described with reference to the drawings. The embodiments do not intend to limit the present disclosure.

First Embodiment

Figure 1A:
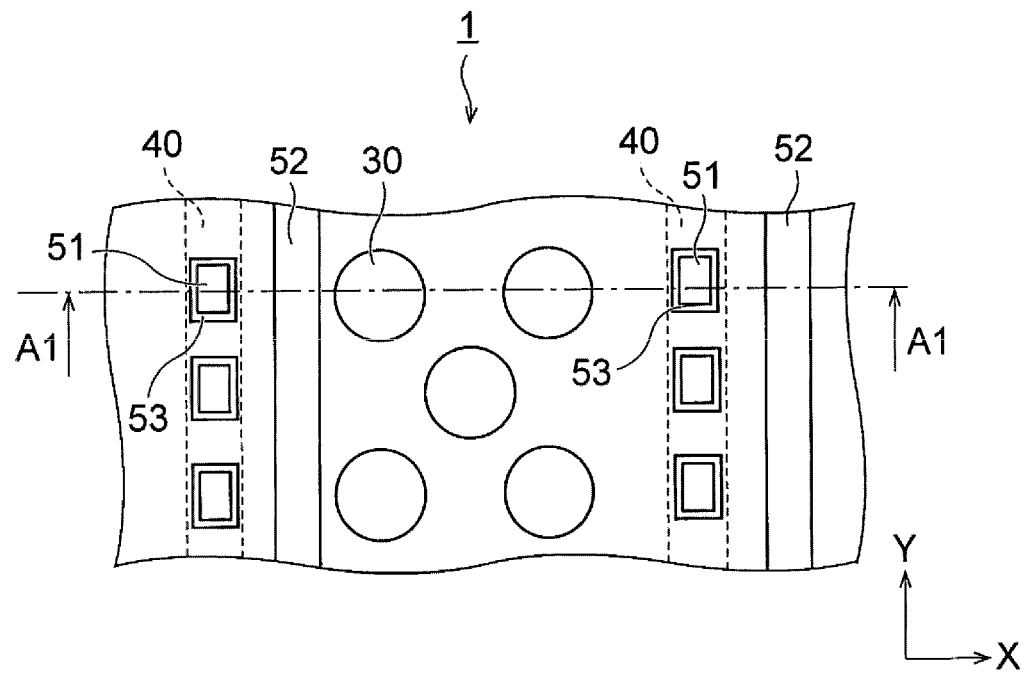
FIG. 1A is a plan view of a semiconductor storage device according to a first embodiment, illustrating a schematic configuration of the semiconductor storage device.
Figure 1B:
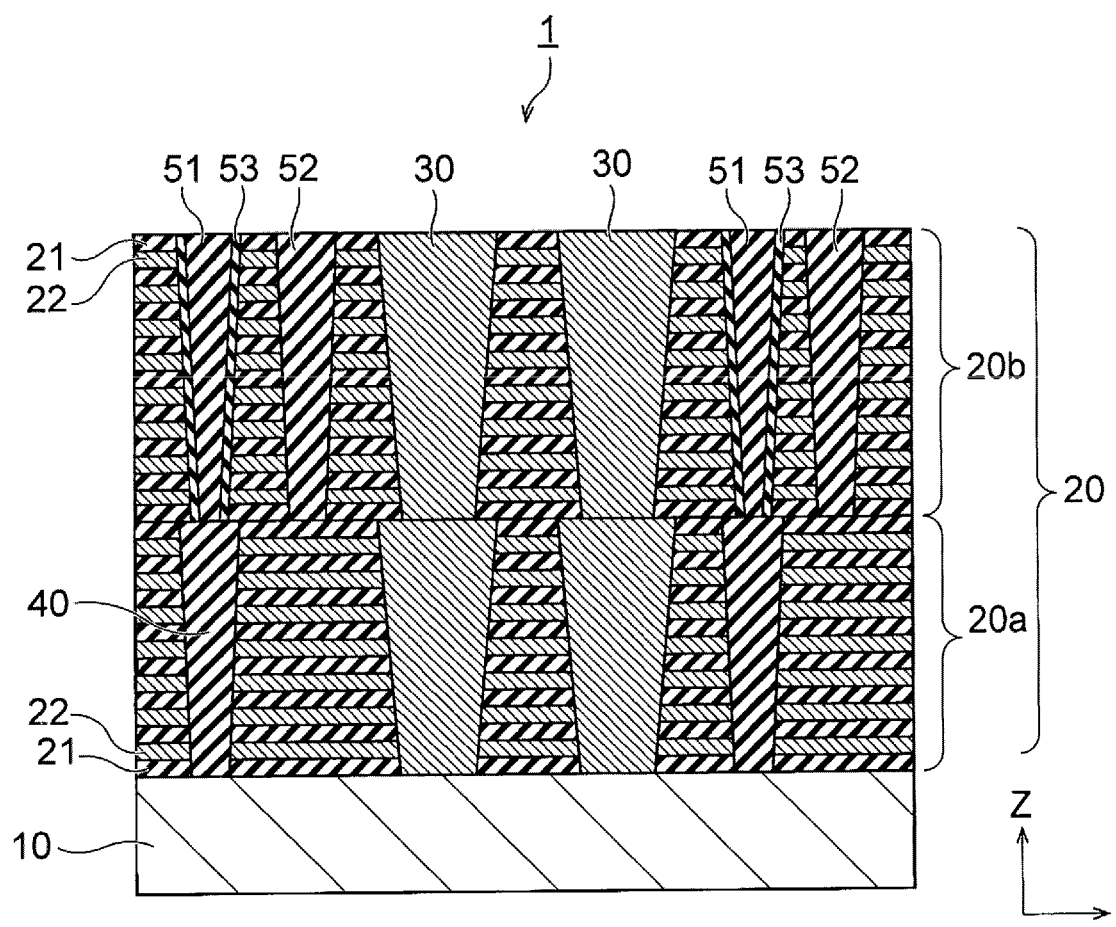
FIG. 1B is a cross-sectional view taken along the line A1-A1 in FIG. 1A.

FIG. 1A is a plan view of a semiconductor storage device according to a first embodiment, illustrating a schematic configuration of the semiconductor storage device. FIG. 1B is a cross-sectional view taken along the line A1-A1 in FIG. 1A. The semiconductor storage device according to at least one embodiment is a three-dimensional semiconductor memory including stacked memory cells.

A semiconductor storage device 1 illustrated in FIGS. 1A and 1B includes a semiconductor substrate 10, a stacked body 20, memory films 30, lower layer separation films 40 (the first separation or division films), films 51 (the discrete films), and upper layer separation films 52 (the second separation or division films).

The semiconductor substrate 10 is, for example, a silicon substrate. The stacked body 20 is disposed on the semiconductor substrate 10. Transistors, such as MOSFETs, to drive the memory may be disposed on the semiconductor substrate 10. The transistors to drive the memory may be disposed in a region other than a region on the semiconductor substrate 10.

The stacked body 20 includes a lower layer stacked body 20a (the first stacked body) and an upper layer stacked body 20b (the second stacked body) stacked on the lower layer stacked body 20a. The lower layer stacked body 20a and the upper layer stacked body 20b each include a plurality of insulating layers 21 and a plurality of electrode layers 22 alternately stacked in a Z direction (the first direction) in FIG. 1B. Electrode layers 22a (the first electrode layers) of the lower layer stacked body 20a and electrode layers 22b (the second electrode layers) of the upper layer stacked body 20b are layers of a metal such as tungsten (W). Each of the electrode layers 22 functions as a word line electrically connected to each of a plurality of memory elements (described later with reference to FIG. 2) of each of the memory films 30. The memory film 30 has a configuration including the plurality of memory elements connected in series in the Z direction and select transistors (not illustrated) connected to both terminals of the plurality of memory elements. Some of the electrode layers 22 function as gate electrodes of the select transistors to select the plurality of memory elements. Each of the insulating layers 21 separates and insulates the electrode layers 22 on and under the insulating layer 21, and the insulating layers 21 are, for example, silicon oxide layers ($SiO_2$).

Figure 2:
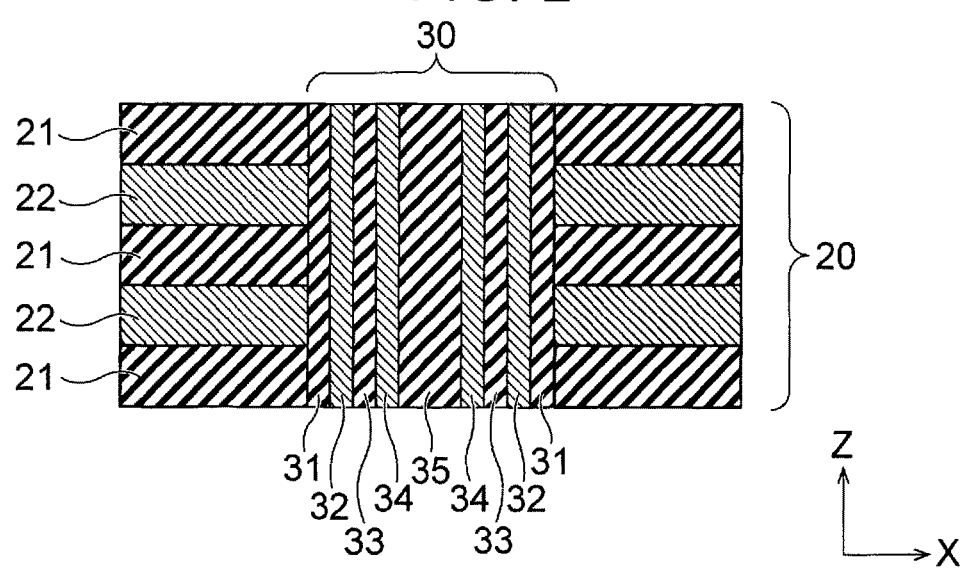
FIG. 2 is a cross-sectional view of a memory film, illustrating an example of the configuration of the memory film.

FIG. 2 is a cross-sectional view of memory elements in the configuration of the memory film 30. FIG. 2 illustrates two memory elements by way of example. The memory film 30 is a pillar-shaped member extending in the Z direction in the stacked body 20. The memory film 30 in FIG. 2 includes a charge block film 31, a charge storage film 32, a tunnel insulating film 33, a channel film 34, and a core film 35.

The charge block film 31, the tunnel insulating film 33, and the core film 35 are, for example, silicon oxide films. Examples of the charge storage film 32 include a silicon nitride film (SiN). The channel film 34 is, for example, a polysilicon film and is also referred to as semiconductor film. It should be noted that the configuration of the memory film 30 is not limited to the configuration illustrated in FIG. 2. It should be also noted that the above-mentioned select transistors have a similar configuration.

Referring back to FIGS. 1A and 1B, a separation structure including the lower layer separation films 40, the films 51, and the upper layer separation films 52 is disposed around the memory films 30. This separation structure separates the stacked body 20 in an X direction (the third direction) orthogonal to the Z direction. The lower layer separation films 40, the films 51, and the upper layer separation films 52 are, for example, silicon oxide films.

In this embodiment, each of the lower layer separation films 40 separates or divides the lower layer stacked body 20a in the X direction. Each of the upper layer separation films 52 separates the upper layer stacked body 20b in the X direction. It should be noted that in this embodiment, the sum of the number of the films 51 and the number of the upper layer separation films 52 to separate or divide the upper layer stacked body 20b is larger than the number of the lower layer separation films 40 to separate the lower layer stacked body 20a.

Each of the films 51 is surrounded by a protective film 53 on the lower layer separation film 40. Examples of the protective film 53 include a film of oxide such as low temperature oxide (LTO). The upper layer separation films 52 are away in the X direction from the films 51.

In at least one embodiment, the films 51 are disposed in a dotted manner in a Y direction (the second direction) in plan view. The lower layer separation films 40 and the upper layer separation films 52 are formed to extend linearly in the Y direction in plan view.

Description will now be made on a manufacturing procedure of the semiconductor storage device 1 of the above-described configuration.

Figure 3A:
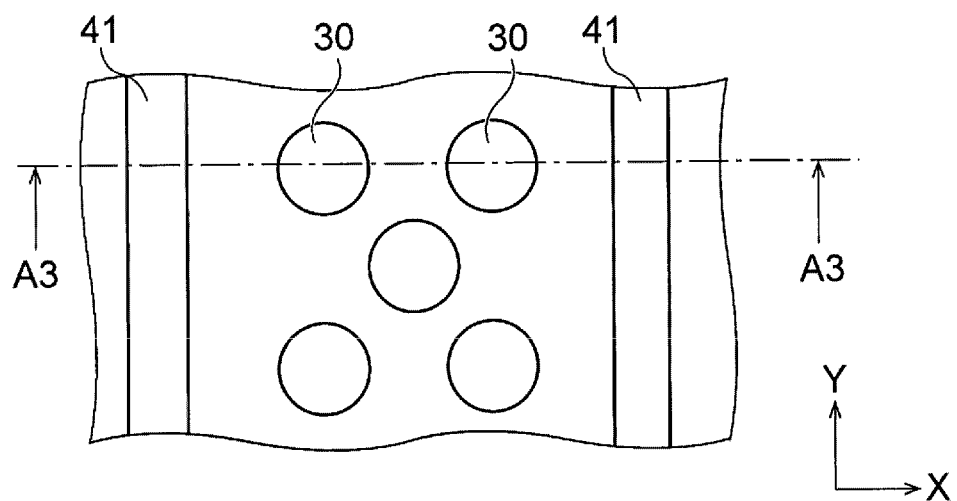
FIG. 3A is a plan view illustrating a step of forming lower layer slits.
Figure 3B:
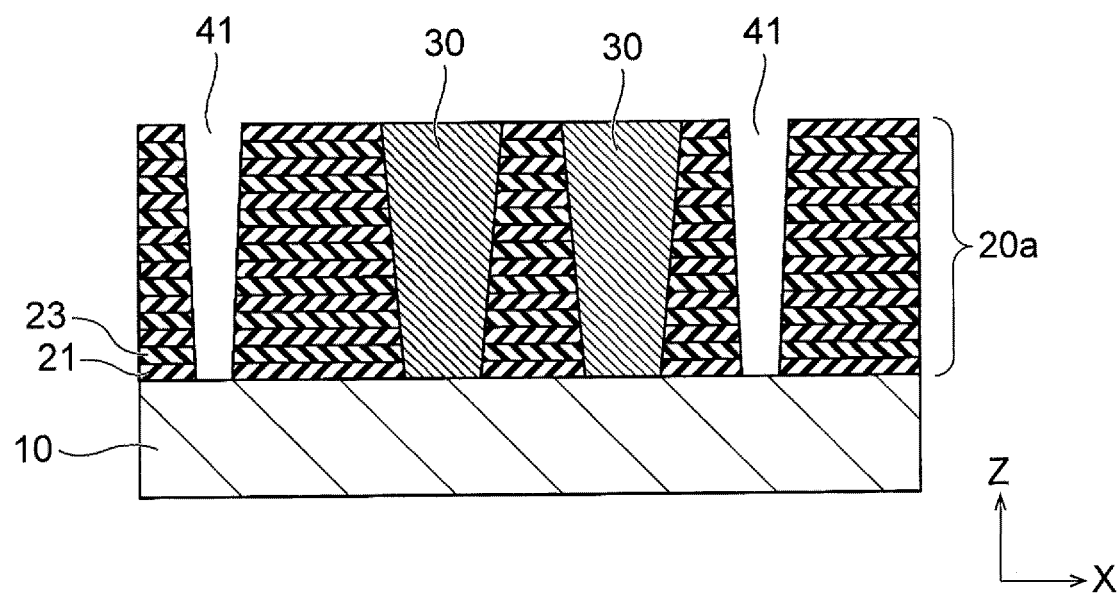
FIG. 3B is a cross-sectional view taken along the line A3-A3 in FIG. 3A.

FIG. 3A is a plan view illustrating a step of forming lower layer slits. FIG. 3B is a cross-sectional view taken along the line A3-A3 in FIG. 3A.

As illustrated in FIGS. 3A and 3B, first using a method such as reactive ion etching (RIE), the lower layer stacked body 20a is etched until a surface of the semiconductor substrate 10 is exposed from a facial layer of the lower layer stacked body 20a so as to form lower layer slits 41. Each of the lower layer slits 41 is a region where the above-described lower layer separation film 40 is filled.

Prior to forming the lower layer slits 41, the lower layer stacked body 20a is formed by alternately stacking the plurality of insulating layers 21 and a plurality of insulating layers 23 in the Z direction on the semiconductor substrate 10 using a method such as chemical vapor deposition (CVD) and atomic layer deposition (ALD). The insulating layers 23 are to be replaced with the electrode layers 22 and are, for example, silicon nitride films. The memory films 30 are formed in the lower layer stacked body 20a. A region where the memory films 30 are formed is separated by the lower layer slits 41.

Figure 4A:
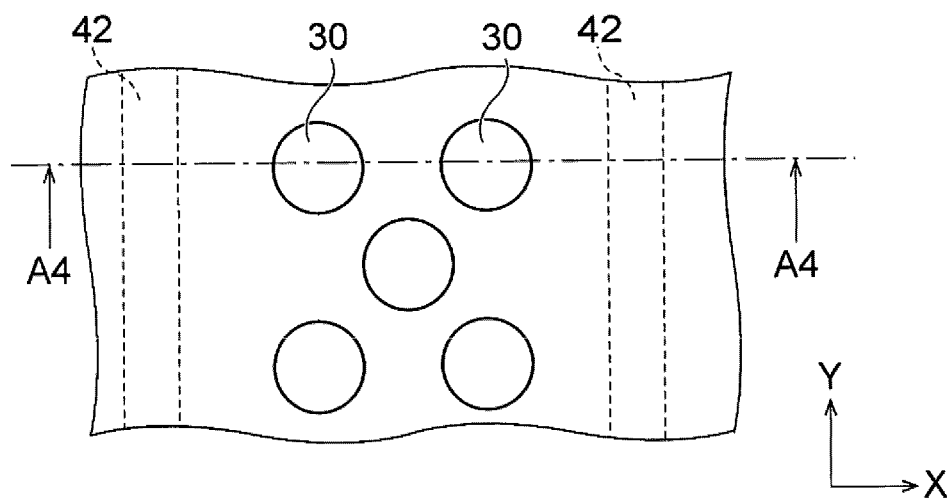
FIG. 4A is a plan view illustrating a step of forming an upper layer stacked body.
Figure 4B:
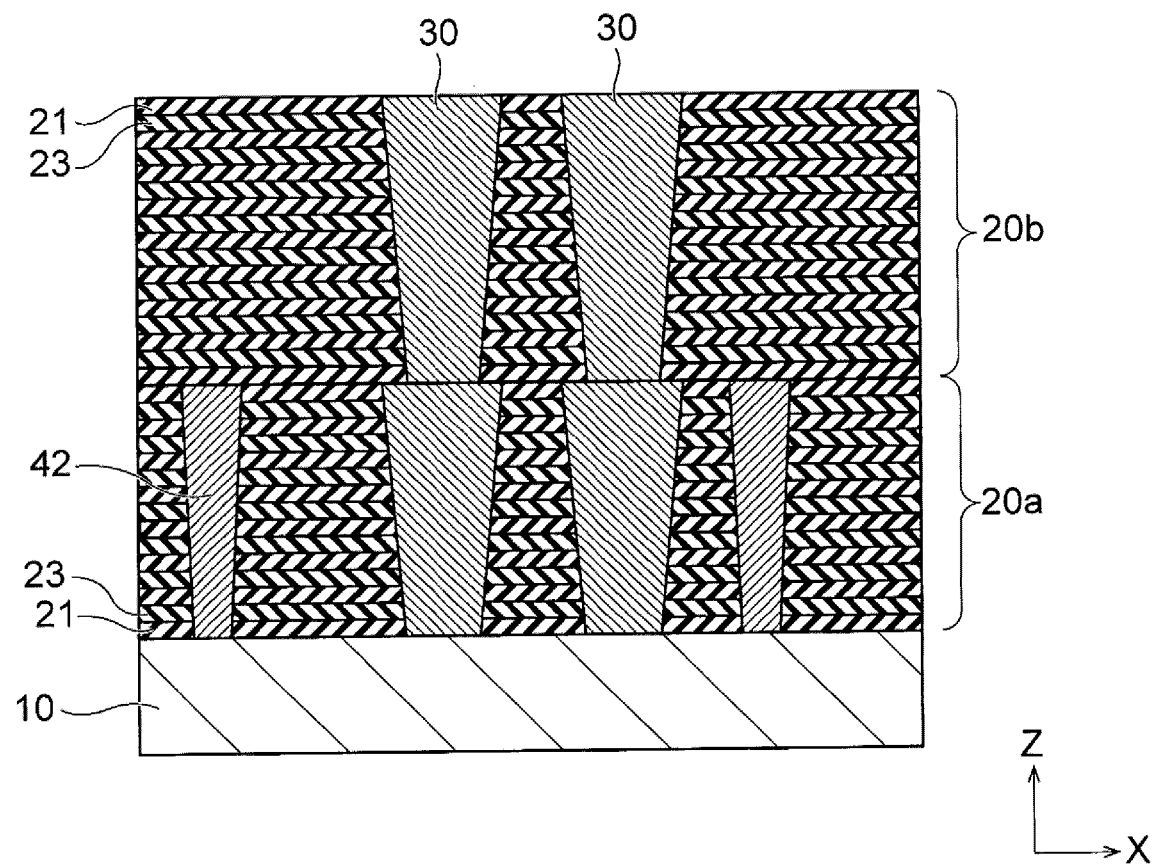
FIG. 4B is a cross-sectional view taken along the line A4-A4 in FIG. 4A.

Next, a step of forming the upper layer stacked body 20b is performed. FIG. 4A is a plan view illustrating the step of forming the upper layer stacked body 20b. FIG. 4B is a cross-sectional view taken along the line A4-A4 in FIG. 4A.

At the step illustrated in FIGS. 4A and 4B, the upper layer stacked body 20b is formed on the lower layer stacked body 20a. It should be noted that prior to forming the upper layer stacked body 20b, a sacrificial film 42 is filled in each of the lower layer slits 41. Examples of the sacrificial film 42 include an amorphous silicon film.

In a similar manner to the lower layer stacked body 20a, the upper layer stacked body 20b is formed by alternately stacking the plurality of insulating layers 21 and the plurality of insulating layers 23 in the Z direction. Also, in a similar manner to the lower layer stacked body 20a, the memory films 30 are formed in the upper layer stacked body 20b. The memory films 30 formed in the upper layer stacked body 20b are formed on the memory films 30 formed in the lower layer stacked body 20a.

Figure 5A:
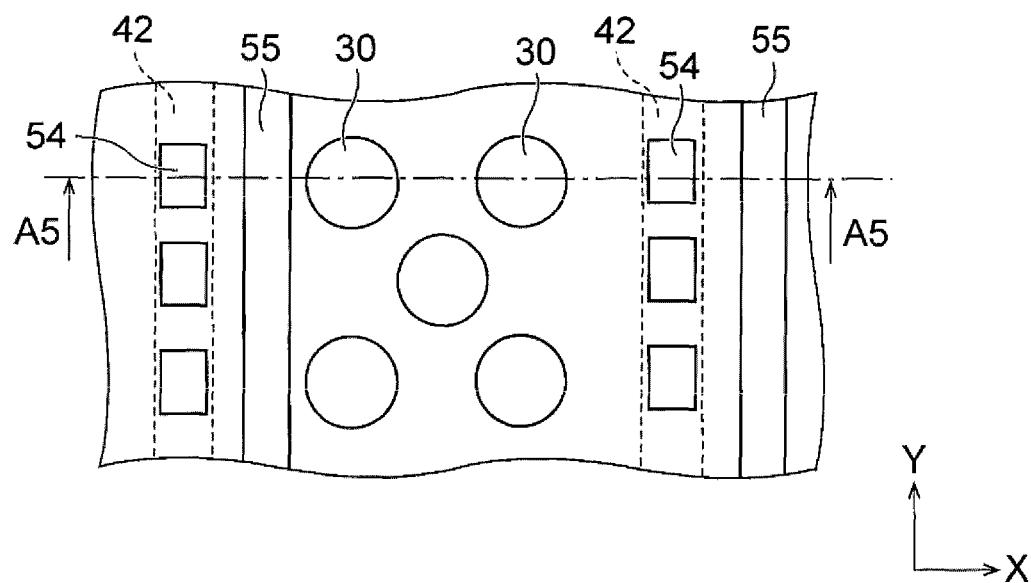
FIG. 5A is a plan view illustrating a step of forming upper layer slits.
Figure 5B:
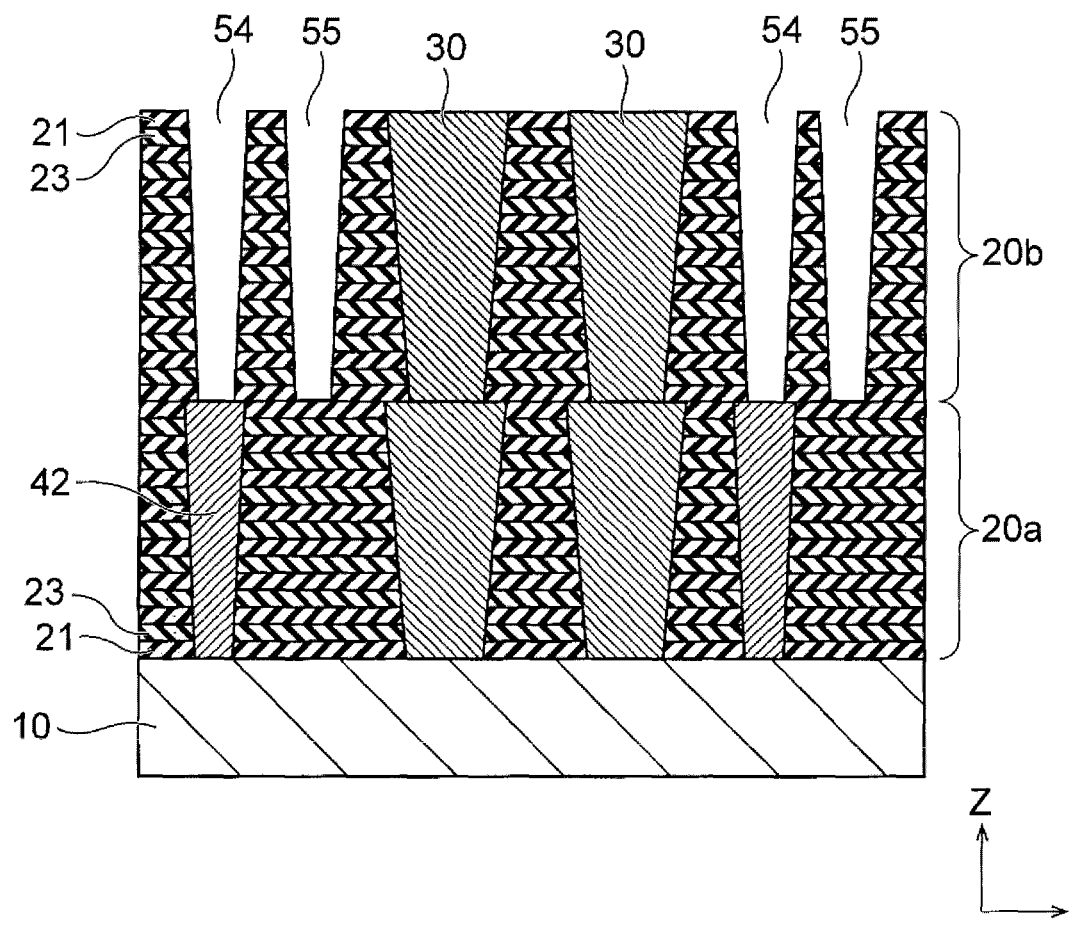
FIG. 5B is a cross-sectional view taken along the line A5-A5 in FIG. 5A.

Next, a step of forming upper layer slits is performed. FIG. 5A is a plan view illustrating the step of forming the upper layer slits. FIG. 5B is a cross-sectional view taken along the line A5-A5 in FIG. 5A.

At the step illustrated in FIGS. 5A and 5B, first upper layer slits 54 and second upper layer slits 55 are formed to extend through the upper layer stacked body 20b using RIE, for example. The first upper layer slits 54 and the second upper layer slits 55 are regions where the films 51 and the upper layer separation films 52 described above are respectively filled. The first upper layer slits 54 are formed in a dotted manner on the sacrificial films 42. At this time, the sacrificial films 42 function as etching stopper films. The second upper layer slits 55 are formed to extend linearly in the Y direction.

Figure 6A:
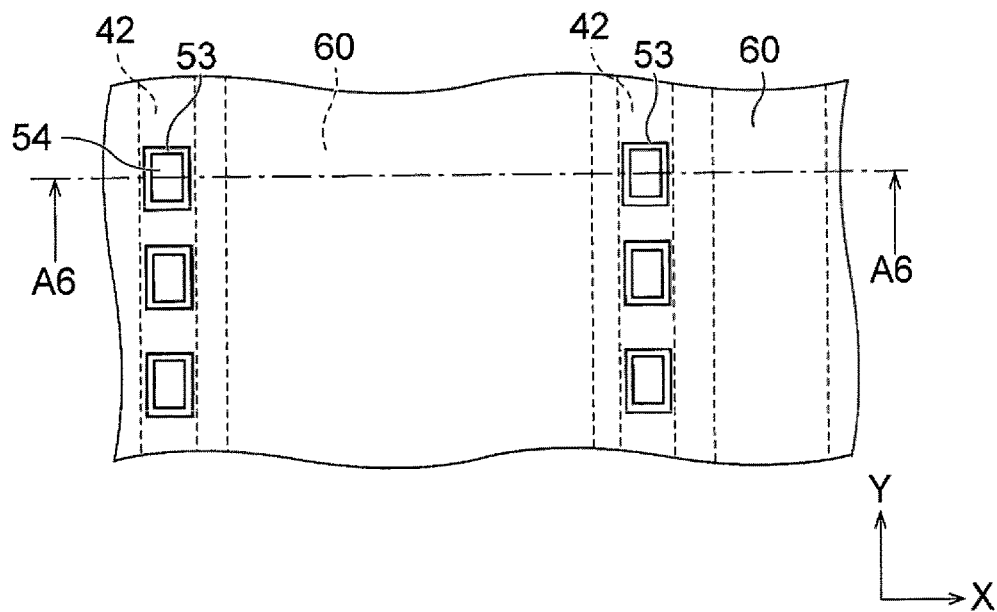
FIG. 6A is a plan view illustrating a step of forming resists and protective films.
Figure 6B:
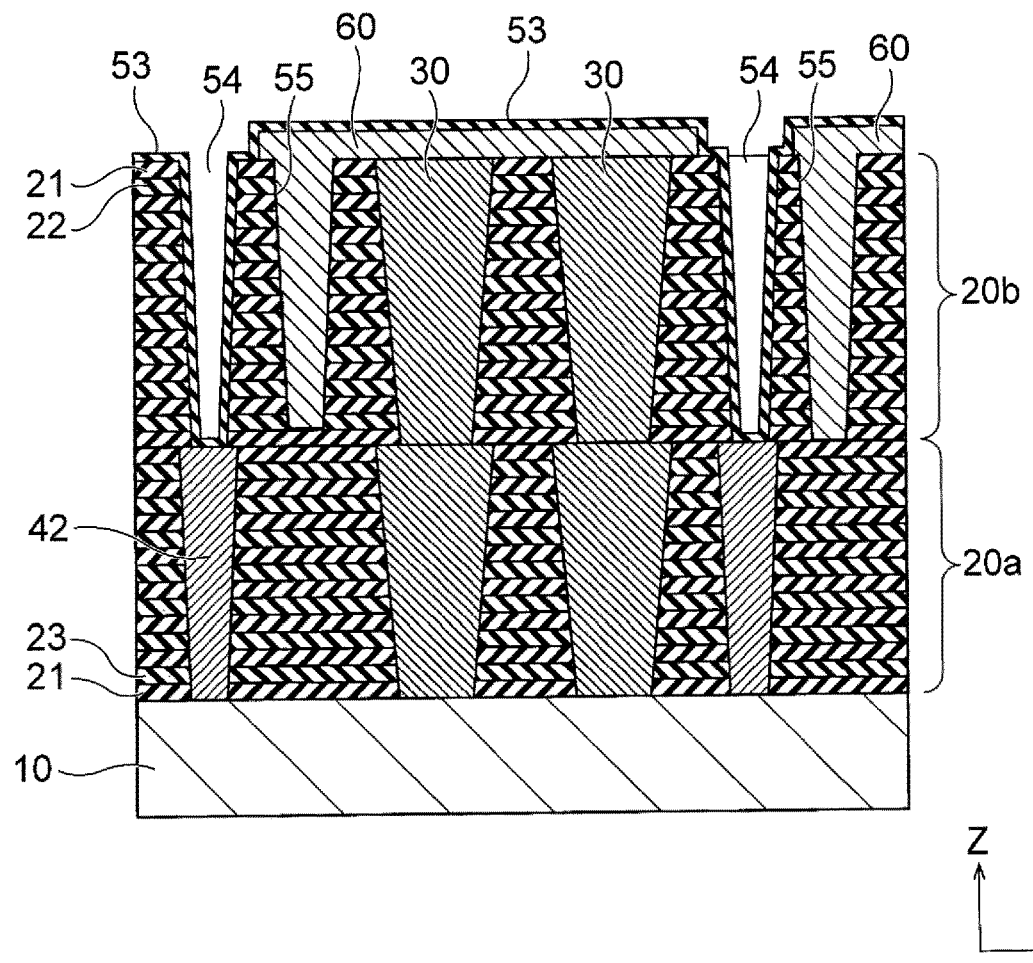
FIG. 6B is a cross-sectional view taken along the line A6-A6 in FIG. 6A.

Next, a step of forming resists and the protective films 53 is performed. FIG. 6A is a plan view illustrating the step of forming the resists and the protective films 53. FIG. 6B is a cross-sectional view taken along the line A6-A6 in FIG. 6A.

At the step illustrated in FIGS. 6A and 6B, resists 60 are filled in the second upper layer slits 55 and cover the memory films 30. The protective films 53 are formed on inner circumferential surfaces and bottom surfaces of the first upper layer slits 54 and cover the resists 60.

Figure 7A:
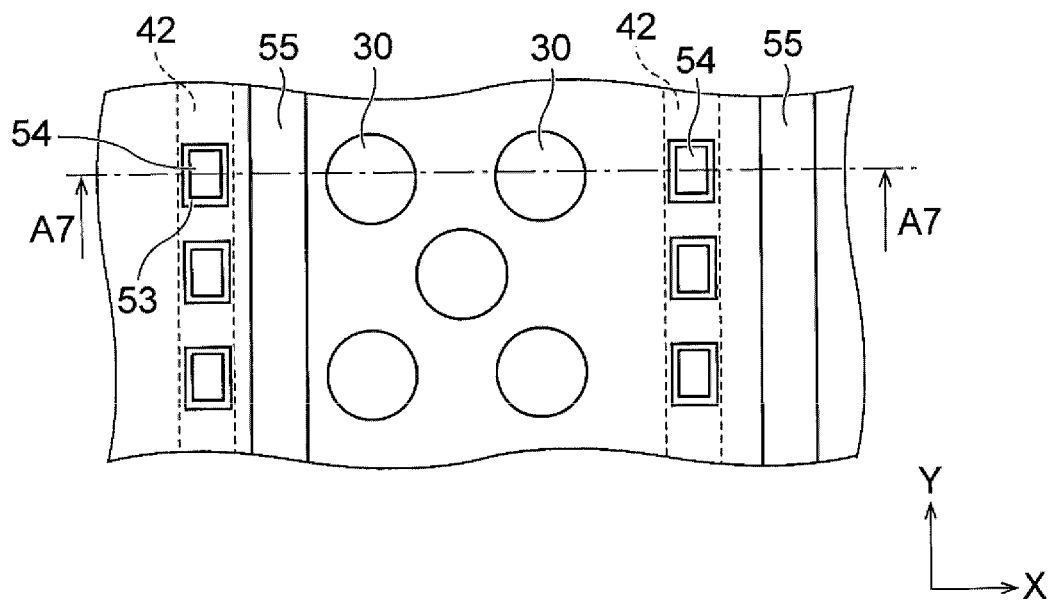
FIG. 7A is a plan view illustrating a step of etching the protective films.
Figure 7B:
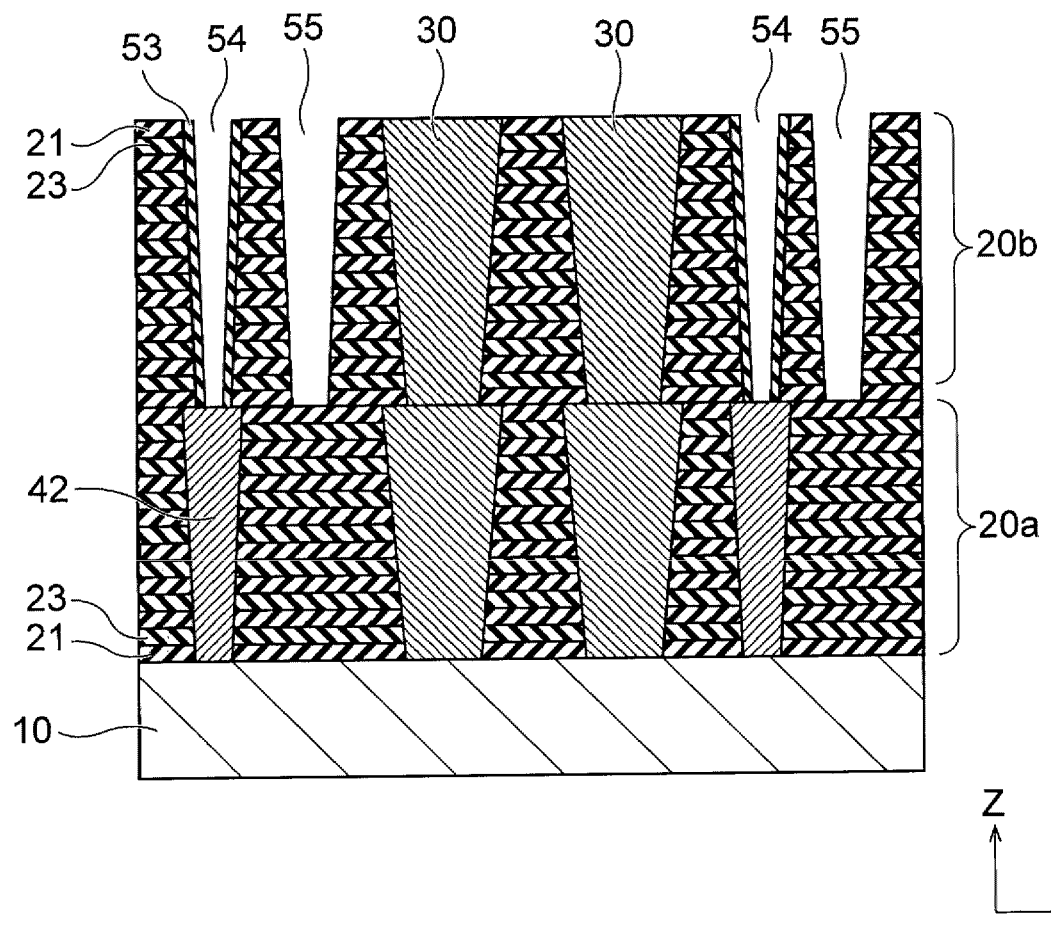
FIG. 7B is a cross-sectional view taken along the line A7-A7 in FIG. 7A.

Next, an etching step is performed to partly remove the protective films 53. FIG. 7A is a plan view illustrating the etching step of the protective films 53. FIG. 7B is a cross-sectional view taken along the line A7-A7 in FIG. 7A.

At the step illustrated in FIGS. 7A and 7B, the protective films 53 on the bottom surfaces of the first upper layer slits 54 and on the memory films 30 are removed by RIE, for example. Thus, the sacrificial films 42 and the resists 60 are exposed. After that, the resists 60 are also removed.

Figure 8A:
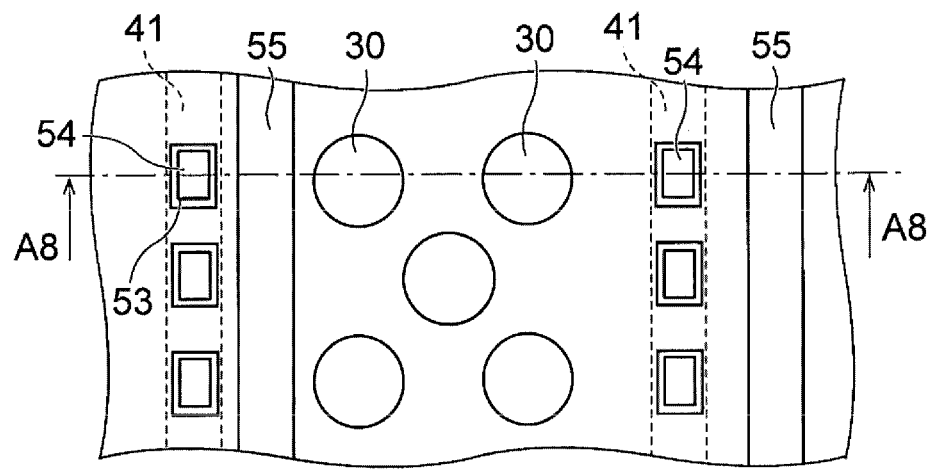
FIG. 8A is a plan view illustrating a step of etching sacrificial films.
Figure 8B:
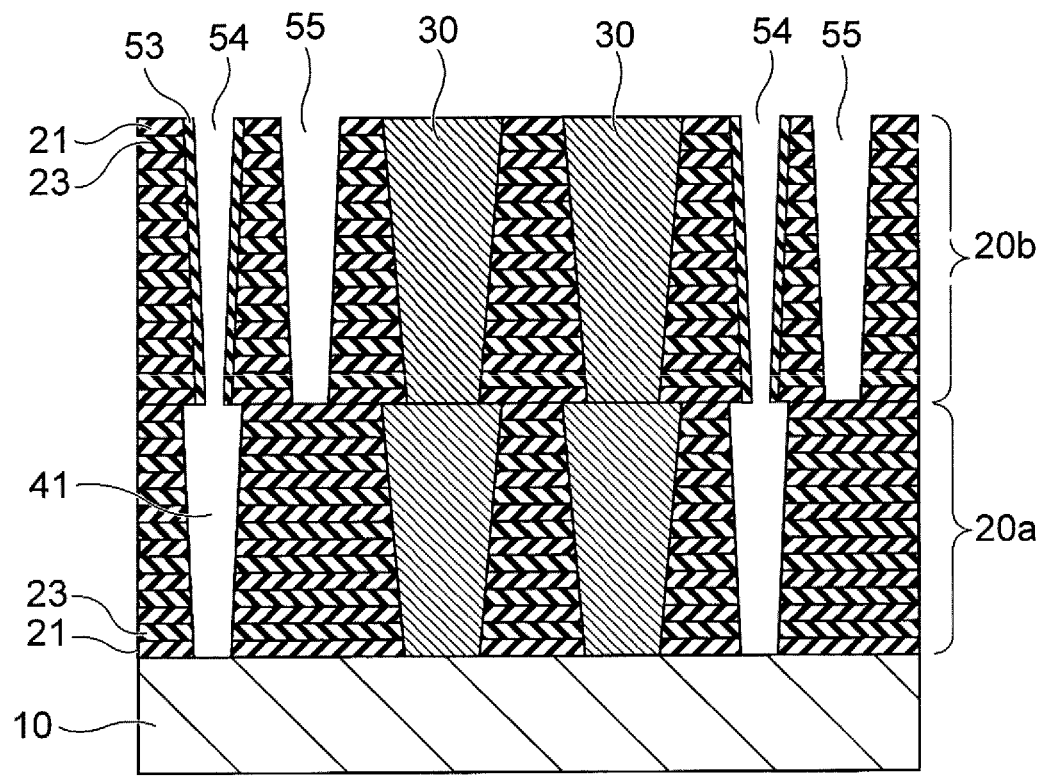
FIG. 8B is a cross-sectional view taken along the line A8-A8 in FIG. 8A.

Next, an etching step of the sacrificial films 42 is performed. FIG. 8A is a plan view illustrating the etching step of the sacrificial films 42. FIG. 8B is a cross-sectional view taken along the line A8-A8 in FIG. 8A.

At the step illustrated in FIGS. 8A and 8B, the sacrificial films 42 are removed by RIE, for example. At this time, the protective films 53 in the first upper layer slits 54 prevent the insulating layers 21 and the insulating layers 23 of the upper layer stacked body 20b from being damaged.

Figure 9A:
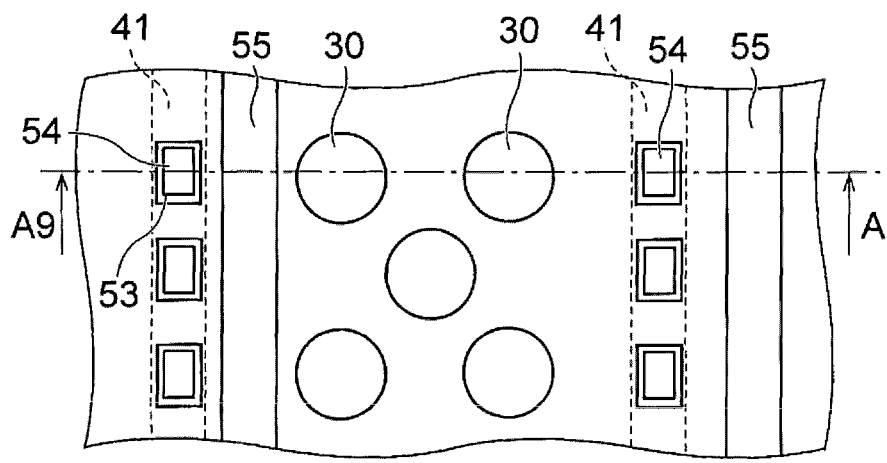
FIG. 9A is a plan view illustrating a step of etching insulating layers.
Figure 9A:
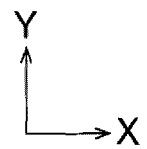
Figure 9B:
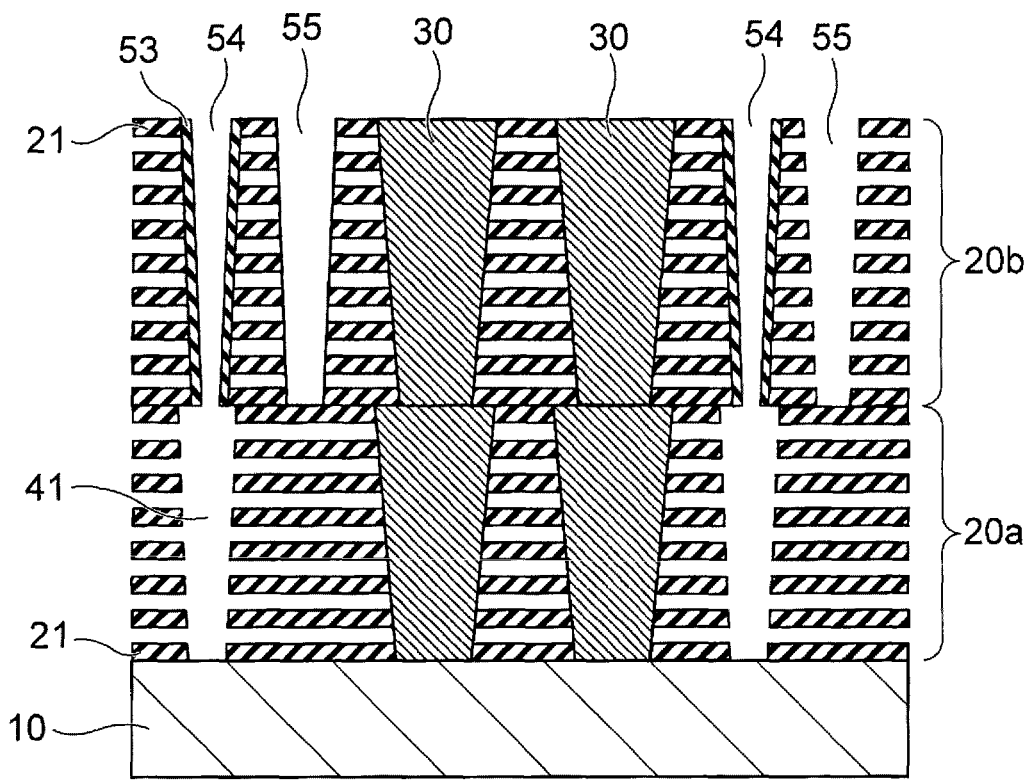
FIG. 9B is a cross-sectional view taken along the line A9-A9 in FIG. 9A.
Figure 9B:
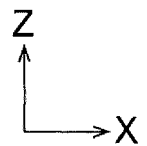

Next, an etching removal step of the insulating layers 23 is performed. FIG. 9A is a plan view illustrating the etching step of the insulating layers 23. FIG. 9B is a cross-sectional view taken along the line A9-A9 in FIG. 9A.

At the step illustrated in FIGS. 9A and 9B, the upper layer stacked body 20b and the lower layer stacked body 20a are immersed in chemical solution. This chemical solution enters the upper layer stacked body 20b and the lower layer stacked body 20a from the lower layer slits 41, the first upper layer slits 54, and the second upper layer slits 55. As a result, the insulating layers 23 are etched. For this chemical solution, preferably, a solution having a high selection ratio with respect to the insulating layers 21, such as phosphoric acid solution, is used.

Figure 10A:
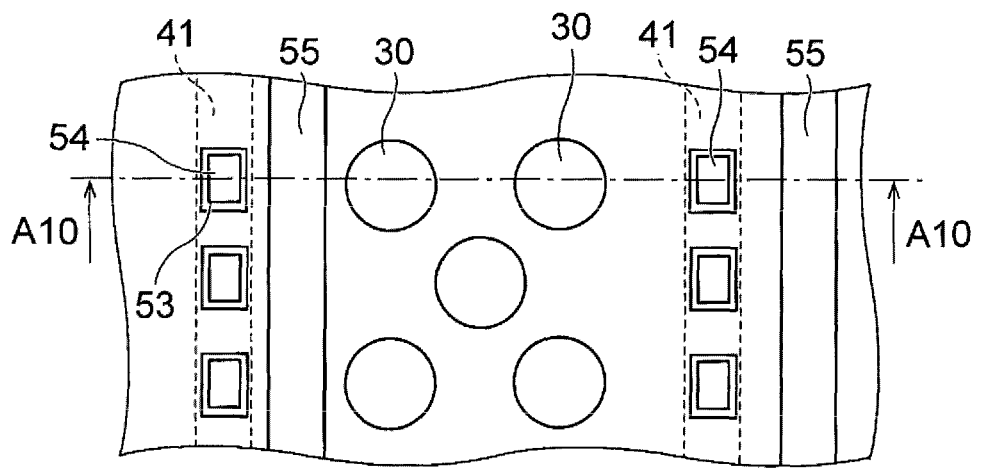
FIG. 10A is a plan view illustrating a step of forming electrode layers.
Figure 10B:
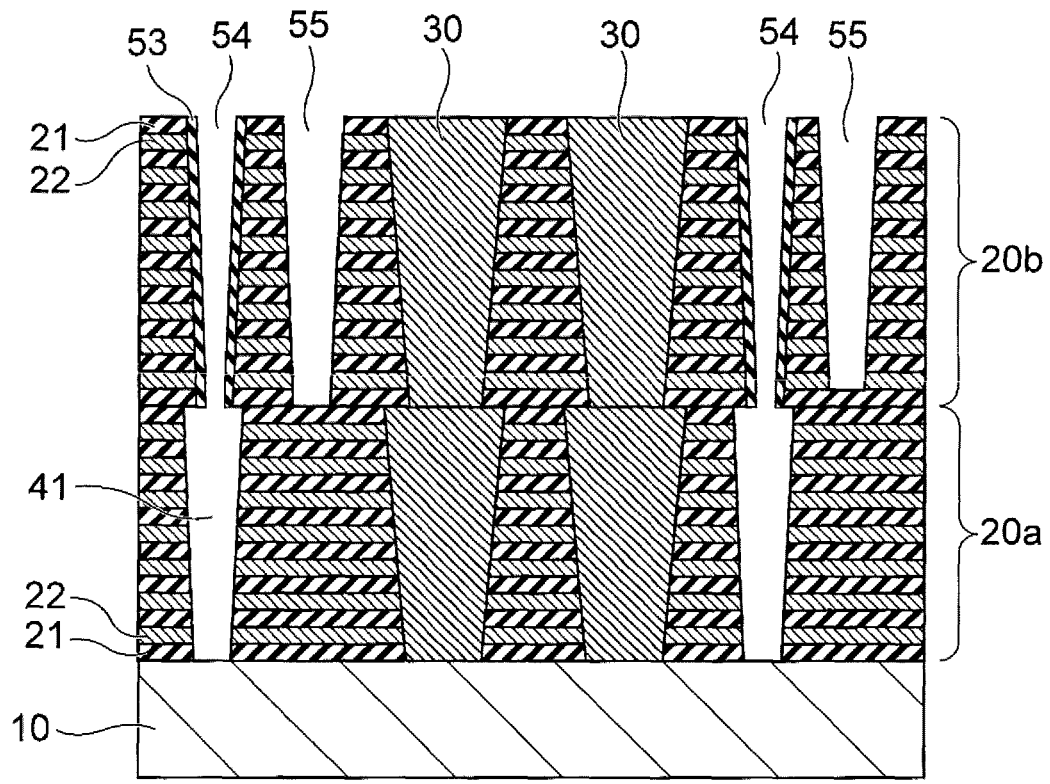
FIG. 10B is a cross-sectional view taken along the line A10-A10 in FIG. 10A.

Next, a forming step of the electrode layers 22 is performed. FIG. 10A is a plan view illustrating the forming step of the electrode layers 22. FIG. 10B is a cross-sectional view taken along the line A10-A10 in FIG. 10A.

At the step illustrated in FIGS. 10A and 10B, using a method such as CVD and ALD, the electrode layers 22 are formed at positions where the insulating layers 23 are removed. That is, the insulating layers 23 are replaced with the electrode layers 22.

Finally, referring back to FIGS. 1A and 1B, silicon oxide is filled in the lower layer slits 41, the first upper layer slits 54, and the second upper layer slits 55. Thus, the lower layer separation films 40, the films 51, and the upper layer separation films 52 are formed. As a result, the number of the separation films gradually increases from a lowermost layer to an uppermost layer of the stacked body 20.

According to the above-described embodiment, the slits used for etching the insulating layers 23 are divided into slits in a lower layer part and slits in an upper layer part of the stacked body 20. Therefore, even when the number of stacked layers of the stacked body 20 increases, a volume of the insulating layers 23 etched by the chemical solution from each of the slits in the upper layer part and the lower layer part can be reduced as compared with a case of collectively forming slits in a stacked body having the same number of stacked layers. This eliminates need to form wide slits, thereby preventing memory area from increasing in area and preventing the whole semiconductor storage device 1 from increasing in size.

Furthermore, according to at least one embodiment, the first upper layer slits 54 are disposed in such a dotted manner that at the step of etching removal of the insulating layers 23 in FIGS. 9A and 9B, the chemical solution is diffused concentrically from the first upper layer slits 54. That is, etching of the insulating layers 23 progresses not only from the second upper layer slits 55 (from the second upper layer slit 55 on the left in FIGS. 9A and 9B) but also from the first upper layer slits 54 (from the first upper layer slit 54 on the right in FIGS. 9A and 9B). This reduces etching time.

It should be noted that although in this embodiment, the slits are divided into two parts, namely, the lower layer part and the upper layer part of the stacked body 20, the number of division is not limited to two in particular. In accordance with a further increase in the number of stacked layers, the stacked body 20 may be divided into, for example, a lower layer part, an intermediate layer part, and an upper layer part to form the slits in each of the parts. In this case as well, the number of slits is increased in sequence of the lower layer part, the intermediate layer part, and the upper layer part to limit the width of the slits.

Second Embodiment

Figure 11:
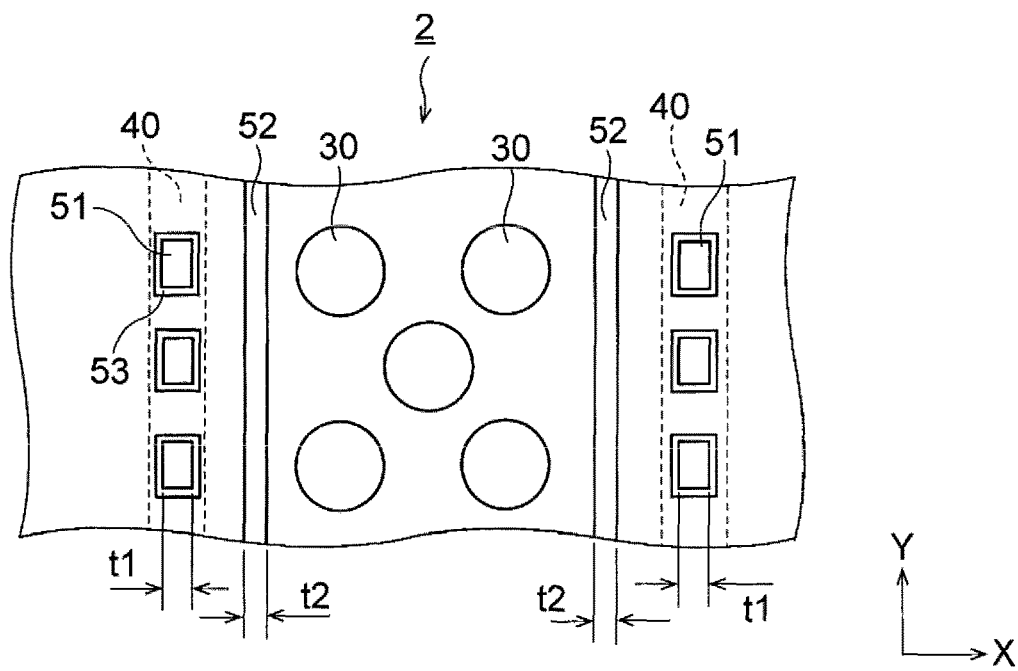
FIG. 11 is a plan view of a semiconductor storage device according to a second embodiment, illustrating a schematic configuration of the semiconductor storage device.

FIG. 11 is a plan view of a semiconductor storage device according to a second embodiment, illustrating a schematic configuration of the semiconductor storage device. Substantially the same components as in the first embodiment described above are denoted with identical reference numerals and will not be elaborated here.

In a semiconductor storage device 2 according to at least one embodiment, a width of each of the second upper layer slits 55 is set to be smaller than a width of each of the first upper layer slits 54. This decreases an area that the second upper layer slits 55 occupy in the whole device so as to further reduce the semiconductor storage device 2 in size.

After that, when the insulating layers 23 are replaced with the electrode layers 22, silicon oxide is filled in the first upper layer slits 54 and the second upper layer slits 55 in substantially the same manner as in the first embodiment. Consequently, as illustrated in FIG. 11, a width t2 of each of the upper layer separation films 52 becomes smaller than a width t1 of each of the films 51.

Figure 12:
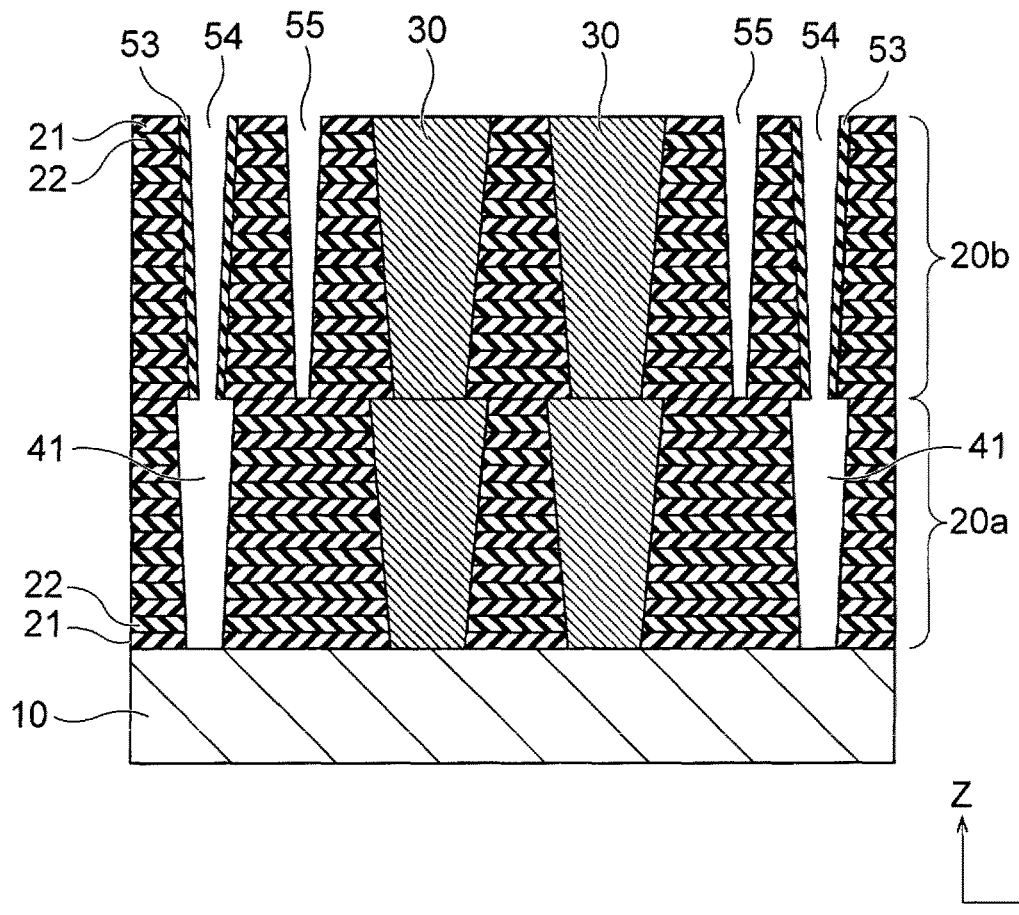
FIG. 12 is a cross-sectional view of the semiconductor storage device according to the second embodiment, illustrating part of a manufacturing procedure of the semiconductor storage device.

In the semiconductor storage device 2 according to at least one embodiment, as illustrated in FIG. 12, the second upper layer slits 55 are formed on both sides of the memory films 30 with respect to the X direction. In other words, each of the second upper layer slits 55 on both sides is formed between the first upper layer slit 54 and the memory film 30. With this layout, when the insulating layers 23 are removed by etching, the chemical solution is diffused from both sides. This further reduces etching time.

Third Embodiment

Figure 13:
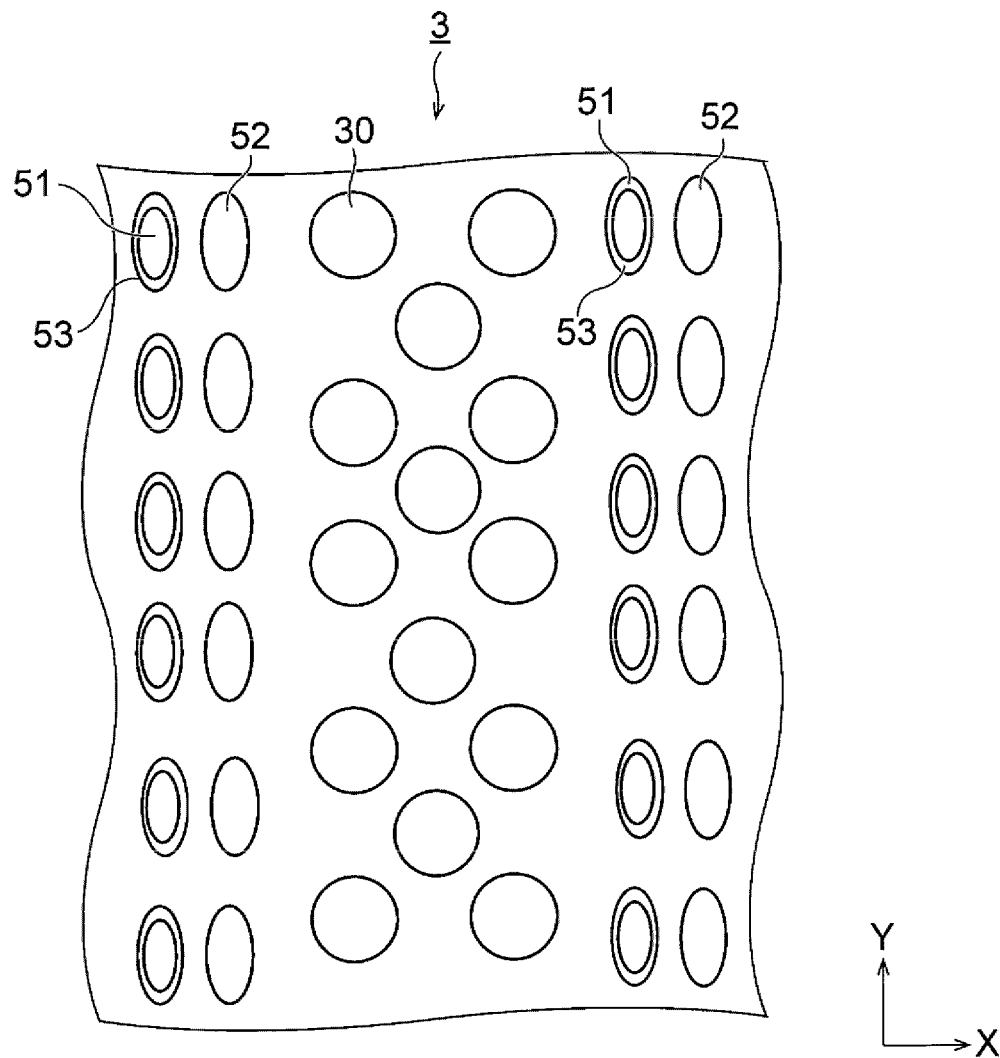
FIG. 13 is a plan view of a semiconductor storage device according to a third embodiment, illustrating a schematic configuration of the semiconductor storage device.

FIG. 13 is a plan view of a semiconductor storage device according to a third embodiment, illustrating a schematic configuration of the semiconductor storage device. Substantially the same components as in the first embodiment described above are denoted with identical reference numerals and will not be elaborated here.

In a semiconductor storage device 3 according to at least one embodiment, the first upper layer slits 54 and the second upper layer slits 55 are formed to have a plurality of elliptic shapes disposed in lines in the Y direction in plan view. Consequently, in removing the insulating layers 23, the chemical solution can be supplied from substantially all directions. It should be noted that the lower layer slits 41 may have substantially the same linear shape as in the first embodiment or may have such a plurality of elliptic shapes as in this embodiment.

After that, when the insulating layers 23 are replaced with the electrode layers 22, silicon oxide is filled in the first upper layer slits 54 and the second upper layer slits 55 in substantially the same manner as in the first embodiment. Consequently, as illustrated in FIG. 13, the films 51 and the upper layer separation films 52 are also formed to have a plurality of elliptic shapes disposed in lines in the Y direction in plan view.

It should be noted that the plan-view shapes of the first upper layer slits 54 (the films 51) and the second upper layer slits 55 (the upper layer separation films 52) are not limited to the elliptic shapes but may be circular shapes. In this case as well, in removing the insulating layers 23, the chemical solution can be supplied from substantially all directions.

Fourth Embodiment

Figure 14:
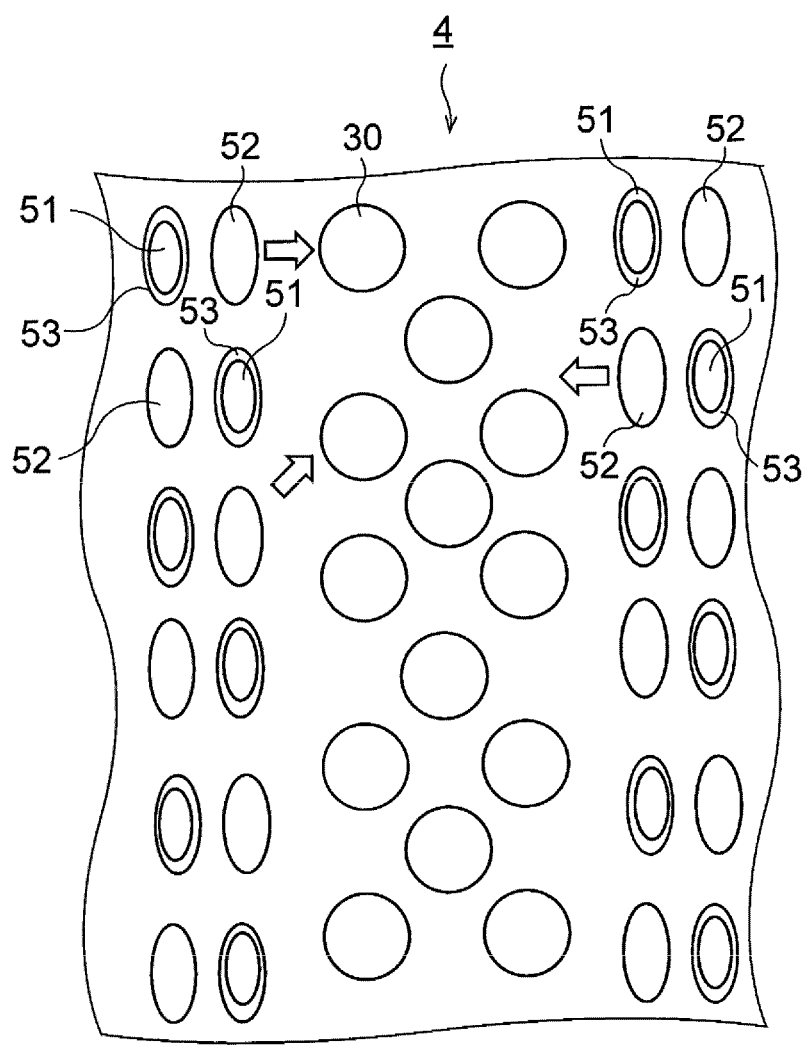
FIG. 14 is a plan view of a semiconductor storage device according to a fourth embodiment, illustrating a schematic configuration of the semiconductor storage device.
Figure 14:
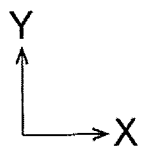

FIG. 14 is a plan view of a semiconductor storage device according to a fourth embodiment, illustrating a schematic configuration of the semiconductor storage device. Substantially the same components as in the first embodiment described above are denoted with identical reference numerals and will not be elaborated here.

In a semiconductor storage device 4 according to at least one embodiment, in substantially the same manner as in the third embodiment described above, the first upper layer slits 54 and the second upper layer slits 55 are formed to have elliptic shapes in plan view. When the first upper layer slits 54 and the second upper layer slits 55 have the layout described in the third embodiment, a flow of the chemical solution from the second upper layer slit 55 on the right of the memory films 30 in FIG. 12, for example, may be interrupted by the first upper layer slit 54.

In view of this, in this embodiment, the first upper layer slits 54 and the second upper layer slits 55 are formed alternately in the Y direction. In other words, the first upper layer slits 54 and the second upper layer slits 55 are formed in a zigzag manner in the Y direction.

The above-described arrangement of the first upper layer slits 54 and the second upper layer slits 55 makes it possible to supply the chemical solution from at least 3 directions as indicated with the outline arrows in FIG. 14. This prevents uneven supply of the chemical solution to the insulating layers 23.

After that, when the insulating layers 23 are replaced with the electrode layers 22, silicon oxide is filled in the first upper layer slits 54 and the second upper layer slits 55 in substantially the same manner as in the first embodiment. Consequently, as illustrated in FIG. 14, the films 51 and the upper layer separation films 52 are also formed alternately in the Y direction.

It should be noted that in at least one embodiment, the lower layer slits 41 may have substantially the same linear shape as in the first embodiment or may have such a plurality of elliptic shapes as in at least one embodiment. The plan-view shapes of the first upper layer slits 54 (the films 51) and the second upper layer slits 55 (the upper layer separation films 52) are not limited to the elliptic shapes but may be circular shapes.

Figure 15:
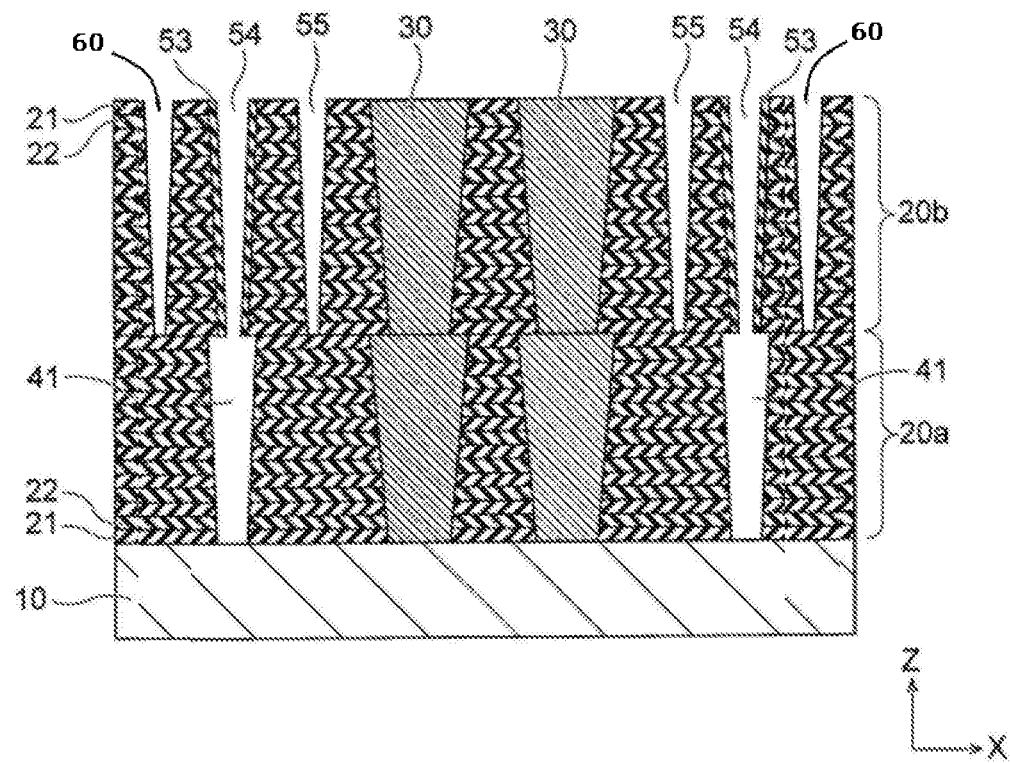
FIG. 15 is a cross-sectional view of the semiconductor storage device according to the second embodiment, illustrating part of a manufacturing procedure of the semiconductor storage device.

In the semiconductor storage device 2 according to at least one embodiment, as illustrated in FIG. 15, additional slits 60 are formed through the upper layer stacked body 20b. The slit 60 is disposed on the side opposite the slit 54 from the slit 55 along the X direction. The slit 54 may be used to form a third separation or division film. In other words, the discrete films (formed by filling up the slit 54) are disposed between the second separation film 52 and the third separation film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first stacked body that comprises a plurality of first electrode layers stacked in a first direction;
   a second stacked body, disposed above the first stacked body, that comprises a plurality of second electrode layers stacked in the first direction;
   a first pillar, extending in the first direction through the first stacked body, that comprises a first semiconductor layer;
   a second pillar, extending in the first direction through the second stacked body, that comprises a second semiconductor layer, the second semiconductor layer electrically connected to the first semiconductor layer;
   a first charge storage layer provided between the plurality of first electrode layers and first semiconductor layer;
   a second charge storage layer provided between the plurality of second electrode layers and second semiconductor layer;
   a first division film, extending in the first direction through the first stacked body, that divides the first stacked body in a second direction crossing the first direction;
   a second division film, extending in the first direction through the second stacked body, that divides the second stacked body in the second direction; and a plurality of first films, extending in the first direction through the second stacked body and separated from each other in a third direction crossing the first direction and the second direction, that are disposed above the first division film, a material of each of the plurality of first films identical to a material of the first division film.

2. The semiconductor storage device according to claim 1, no memory pillar is disposed between the second division film and the plurality of first films.

3. The semiconductor storage device according to claim 1, further comprising:
a third division film, extending in the first direction through the second stacked body, that is separated from the second division film along the second direction, wherein the plurality of first films are disposed between the second division film and the third separation film.

4. The semiconductor storage device according to claim 3, wherein no memory pillar is disposed between the third division film and the plurality of first films.

5. The semiconductor storage device according to claim 1, wherein the plurality of first films are disposed in a dotted manner along a third direction orthogonal to the first direction and the second direction.

6. The semiconductor storage device according to claim 1, wherein a width of each of the second division film is smaller than a width of each of the first films.

7. The semiconductor storage device according to claim 1, wherein the second division film and each of the first films have a circular shape or an elliptic shape from a plan view.

8. The semiconductor storage device according to claim 1, further comprising a plurality of protective films that each surrounds a respective one of the plurality of first films and separates the respective first film from the second electrode layers.

9. The semiconductor storage device according to claim 8, wherein each of the protective films is formed of an oxide material.

10. A semiconductor storage device comprising:
a first stacked body that comprises a plurality of first electrode layers stacked in a first direction;
a second stacked body, disposed above the first stacked body, that comprises a plurality of second electrode layers stacked in the first direction;
a first pillar, extending in the first direction through the first stacked body, that comprises a first semiconductor layer;
a second pillar, extending in the first direction through the second stacked body, that comprises a second semiconductor layer, the second semiconductor layer electrically connected to the first semiconductor layer;
a first charge storage layer provided between the plurality of first electrode layers and first semiconductor layer;
a second charge storage layer provided between the plurality of second electrode layers and second semiconductor layer;
a plurality of first films extending in the first direction through the first stacked body and separated from each other in a third direction crossing the first direction;
a plurality of second films extending in the first direction through the second stacked body and separated from each other in the third direction;
a plurality of third films extending in the first direction through the second stacked body and separated from each other in the third direction, the plurality of third films is disposed on the plurality of first films; and a plurality of fourth films that each surrounds a respective one of the plurality of third films.

11. The semiconductor storage device according to claim 10, no memory pillar is disposed between the plurality of second films and the plurality of third films.

* * * * *